(12) United States Patent
Katada et al.

(10) Patent No.: US 11,057,985 B2
(45) Date of Patent: Jul. 6, 2021

(54) PRINTED WIRING BOARD

(71) Applicant: DENSO TEN Limited, Kobe (JP)

(72) Inventors: Nobuhisa Katada, Kobe (JP); Kotaro Hosogi, Kobe (JP); Yasuyuki Watanabe, Kobe (JP); Toshiyuki Tanaka, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 16/794,605

(22) Filed: Feb. 19, 2020

(65) Prior Publication Data

US 2020/0281069 A1 Sep. 3, 2020

(30) Foreign Application Priority Data

Feb. 28, 2019 (JP) .............................. JP2019-036969
Dec. 18, 2019 (JP) .............................. JP2019-227985

(51) Int. Cl.
*H05K 1/02* (2006.01)
*H05K 1/18* (2006.01)
*H05K 1/11* (2006.01)

(52) U.S. Cl.
CPC ........... *H05K 1/0206* (2013.01); *H05K 1/116* (2013.01); *H05K 1/181* (2013.01); *H05K 1/184* (2013.01); *H05K 2201/0979* (2013.01); *H05K 2201/09609* (2013.01); *H05K 2201/1003* (2013.01); *H05K 2201/10015* (2013.01); *H05K 2201/10022* (2013.01)

(58) Field of Classification Search
CPC ...... H05K 1/0206; H05K 1/181; H05K 1/116; H05K 1/184; H05K 2201/10022; H05K 2201/0979; H05K 2201/1003; H05K 2201/10015; H05K 2201/09609
See application file for complete search history.

(56) References Cited

U.S. PATENT DOCUMENTS

| | | | | |
|---|---|---|---|---|
| 5,373,418 A * | 12/1994 | Hayasi | ................ | H01L 23/4006 257/718 |
| 5,730,932 A * | 3/1998 | Sarkhel | ................ | B23K 35/262 228/180.1 |
| 6,441,312 B1 * | 8/2002 | Tanimura | ............. | H05K 1/0207 174/252 |
| 2004/0108130 A1 * | 6/2004 | Suzuki | ................... | H05K 1/116 174/252 |

(Continued)

FOREIGN PATENT DOCUMENTS

| | | |
|---|---|---|
| JP | 2003-069202 A | 3/2003 |
| JP | 2013-045919 A | 3/2013 |

*Primary Examiner* — Ishwarbhai B Patel
(74) *Attorney, Agent, or Firm* — Oliff PLC

(57) ABSTRACT

A printed wiring board according to an embodiment includes a wiring board body, a first connection part and a second connection part. In the first connection part, a heat-receiving front surface is a first land formed on a front surface of the wiring board body. A heat-receiving back surface is formed on a back surface of the wiring board body. A main-heat conducting part is a through-hole that inter-connects the heat-receiving front surface and the heat-receiving back surface. In the second connection part, a second land is formed on the front surface of the wiring board body. The second land is not connected to any conductor pattern formed on the back surface of the wiring board body.

6 Claims, 5 Drawing Sheets

(56) References Cited

U.S. PATENT DOCUMENTS

| | | | | |
|---|---|---|---|---|
| 2006/0171127 A1* | 8/2006 | Kadoya | .................. | H05K 3/284 |
| | | | | 361/752 |
| 2007/0029108 A1* | 2/2007 | Nakao | .................. | H05K 3/3447 |
| | | | | 174/260 |
| 2011/0061233 A1* | 3/2011 | Martinez-Vargas | ... | H05K 1/116 |
| | | | | 29/839 |
| 2013/0016480 A1* | 1/2013 | Sun | ........................ | H05K 1/115 |
| | | | | 361/720 |

* cited by examiner

PRINTED WIRING BOARD

BACKGROUND OF THE INVENTION

Field of the Invention

The invention relates to a printed wiring board.

Description of the Background Art

There is known a printed wiring board to which an element is soldered by a flow soldering method. The flow soldering method is used for soldering an element having a relatively large heat capacity, such as an electrolytic capacitor. Furthermore, a reflow soldering method is used for soldering an element having a relatively small heat capacity, such as a ceramic capacitor.

Thus, when the element having a large heat capacity and the element having a small heat capacity are soldered to the printed wiring board, both the flow soldering method and the reflow soldering method need to be used.

SUMMARY OF THE INVENTION

According to one aspect of the invention, a printed wiring board includes a wiring board body; a first connection part, and a second connection part. The first connection part has a higher heat conductivity than a heat conductivity of the wiring board body, and connects the wiring board body and a first element. The second connection part has a higher heat conductivity than the heat conductivity of the wiring board body, and connects the wiring board body and a second element. The first connection part includes (i) a heat-receiving front surface, (ii) a heat-receiving back surface, (iii) a main-heat conducting part, and (iv) a sub-heat conducting part. The heat-receiving front surface is a first land formed on a front surface of the wiring board body. The heat-receiving back surface is formed on a back surface of the wiring board body. The main-heat conducting part is a through-hole into which a terminal of the first element is inserted, and which inter-connects the heat-receiving front surface and the heat-receiving back surface. The sub-heat conducting part inter-connects the heat-receiving front surface and the heat-receiving back surface. The second connection part includes a second land. The second land is formed on one of the front and back surfaces of the wiring board body, and is not connected to any conductor pattern formed on an opposite one of the front and back surfaces of the wiring board body. The heat-receiving front surface includes (i) a shielded area and (ii) an exposed area. The shielded area is hidden by the first element when the terminal of the first element is connected to the first connection part, and is connected to an end of the main-heat conducting part. The exposed area is exposed when the first element is connected to the first connection part, and is connected to an end of the sub-heat conducting part.

Thus, it is possible to connect an element having a large heat capacity and an element having a small heat capacity to the printed wiring board with a single reflow soldering. That is, it is possible to simplify soldering of the element having a large heat capacity and the element having a small heat capacity.

According to another aspect of the invention, when the first element is connected to the first connection part, a distance between the main-heat conducting part and an outer edge of the heat-receiving front surface in a predetermined direction is longer than a distance between the terminal of the first element and an outer edge of the first element in the predetermined direction. The predetermined direction is a direction in which, on the front surface of the wiring board body, the distance between the main-heat conducting part and the outer edge of the heat-receiving front surface is greatest.

Thus, when the terminal of the first element is inserted into the main-heat conducting part, an exposed area is provided on the heat-receiving front surface.

These and other objects, features, aspects and advantages of the invention will become more apparent from the following detailed description of the invention when taken in conjunction with the accompanying drawings.

DESCRIPTION OF THE EMBODIMENTS

Figure 1:
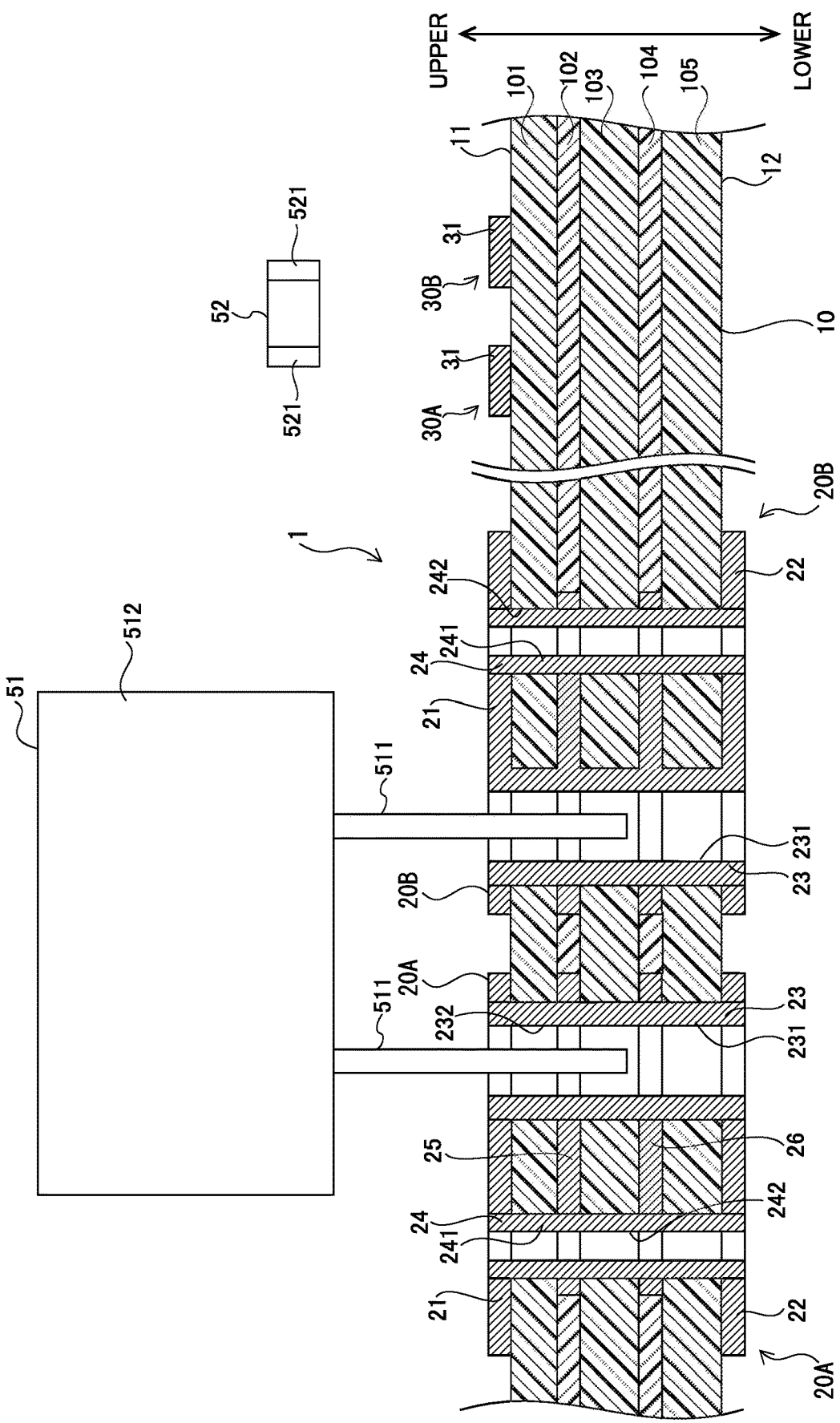
FIG. 1 illustrates a cross section of a printed wiring board according to an embodiment of the invention.

An embodiment of the invention will be described in detail below with reference to the drawings. The same or equivalent parts are denoted by the same reference numerals in the drawings, and the description thereof is not repeated.

<1. Configuration>
<1.1. Configuration of Printed Wiring Board 1>

FIG. 1 illustrates a cross section of a printed wiring board 1 according to an embodiment of the invention. The printed wiring board 1 shown in FIG. 1, for example, complies with the Japanese Industrial Standard (JIS) 5603.

For convenient description purposes, upper and lower directions of the printed wiring board 1 are defined. The upper direction is a direction from a back surface 12 toward a front surface 11 of a wiring board body 10 included in the printed wiring board 1. The lower direction is an opposite direction to the upper direction.

With reference to FIG. 1, the printed wiring board 1 includes the wiring board body 10, a first connection part 20A, a first connection part 20B, a second connection part 30A, and a second connection part 30B. The first connection parts 20A and 20B are connected to an electrolytic capacitor 51 that is a first element by a reflow soldering method. The second connection parts 30A and 30B are connected to a chip component 52 that is a second element. The chip component 52 is, for example, a chip resistor, a chip capacitor, a chip inductor, or the like. In this embodiment, the electrolytic capacitor 51 and the chip component 52 are arranged on an upper surface of the printed wiring board 1. In FIG. 1, the electrolytic capacitor 51 and the chip component 52 are not fixed on the wiring board body 10 by the reflow soldering method.

In FIG. 1, a description of wiring lines that are formed on the wiring board body 10, except for the first connection parts 20A and 20B and the second connection parts 30A and 30B, is omitted.

<1.2. Wiring Board Body 10>

The wiring board body 10 has a flat plate shape and is formed by laminating resin layers 101 to 105. The resin layers 101 to 105 are made of, for example, an epoxy resin.

An upper surface of the resin layer 101 is the front surface 11 of the wiring board body 10. An upper surface of the resin layer 102 contacts a lower surface of the resin layer 101. An upper surface of the resin layer 103 contacts a lower surface of the resin layer 102. An upper surface of the resin layer 104 contacts a lower surface of the resin layer 103. An upper surface of the resin layer 105 contacts a lower surface of the resin layer 104. A lower surface of the resin layer 105 is the back surface 12 of the wiring board body 10.

<1.3. First Connection Parts 20A and 20B>

With reference to FIG. 1, a heat conductivity of each of the first connection parts 20A and 20B is higher than a heat conductivity of the wiring board body 10. Specifically, the first connection parts 20A and 20B are made of conductive metals.

Figure 2:
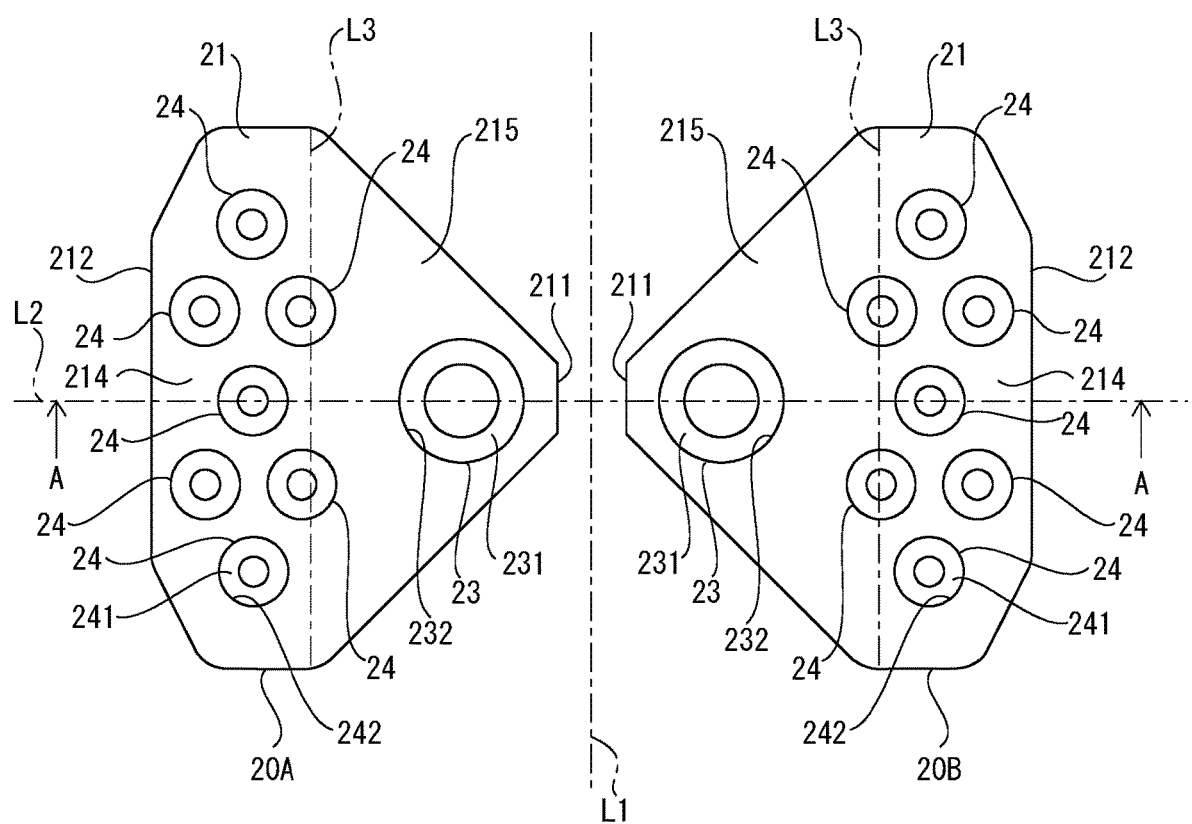
FIG. 2 is a diagram illustrating a shape of a land of a first connection part shown in FIG. 1.

FIG. 2 is a top view of the first connection parts 20A and 20B shown in FIG. 1. In FIG. 2, a description of the wiring board body 10, and the second connection parts 30A and 30B is omitted. Cross sections of the first connection parts 20A and 20B shown in FIG. 1 are cross sections of the first connection parts 20A and 20B along the line A-A shown in FIG. 2. The first connection parts 20A and 20B are arranged plane-symmetrically with respect to a plane including a reference line L1 perpendicular to the wiring board body 10.

With reference to FIG. 2, the first connection parts 20A and 20B include the same configuration. The configuration of the first connection part 20A will be described below, and a detailed description of the configuration of the first connection part 20B will be omitted.

The first connection part 20A includes a heat-receiving front surface 21, a heat-receiving back surface 22, a main-heat conducting part 23, and a plurality of sub-heat conducting parts 24. The heat-receiving front surface 21 is a land that is formed on the front surface 11 of the wiring board body 10. The main-heat conducting part 23 is a through-hole that is formed in the wiring board body 10. In the following description, the heat-receiving front surface 21 is referred to as "land 21". The main-heat conducting part 23 is referred to as "through-hole 23".

[Land (Heat-Receiving Front Surface) 21]

With reference to FIG. 2, the land 21 has a substantially trapezoidal shape, viewed from above, and is formed on the front surface 11 of the wiring board body 10. The land 21 is reflow soldered to one of two terminals 511 included in the electrolytic capacitor 51. The land 21 is connected to an upper end of the through-hole 23 and an upper end of each of the plurality of the sub-heat conducting parts 24.

Hereinafter, assuming that the land 21 has a trapezoidal shape, the land 21 will be described. In the land 21, an edge 211 is one of two edges parallel to the reference line L1 that is closer to the reference line L1. An edge 212 is one of the two edges that is farther away from the reference line L1. The edges 211 and 212 correspond to bottoms of a trapezoid. The edge 211 of the land 21 included in the first connection part 20A is opposite to the edge 211 of the land 21 of the first connection part 20B. The edge 211 is shorter than the edge 212.

The land 21 includes an enlarged area 215. The enlarged area 215 is an area, out of an upper surface of the land 21, from the edge 211 to a reference line L3. The reference line L3 divides the upper surface of the land 21 into two areas, i.e., an area including the edge 211 and an area including the edge 212. The enlarged area 215 is the area including the edge 211 of the two areas divided by the reference line L3. In this embodiment, the reference line L3 is parallel to the reference line L1. A size of the enlarged area 215 in a direction of the reference line L1 increases as being away from the reference line L1. As long as the size of the enlarged area 215 increases as being away from the reference line L1, the shape of the land 21 is not particularly limited.

Figure 3:
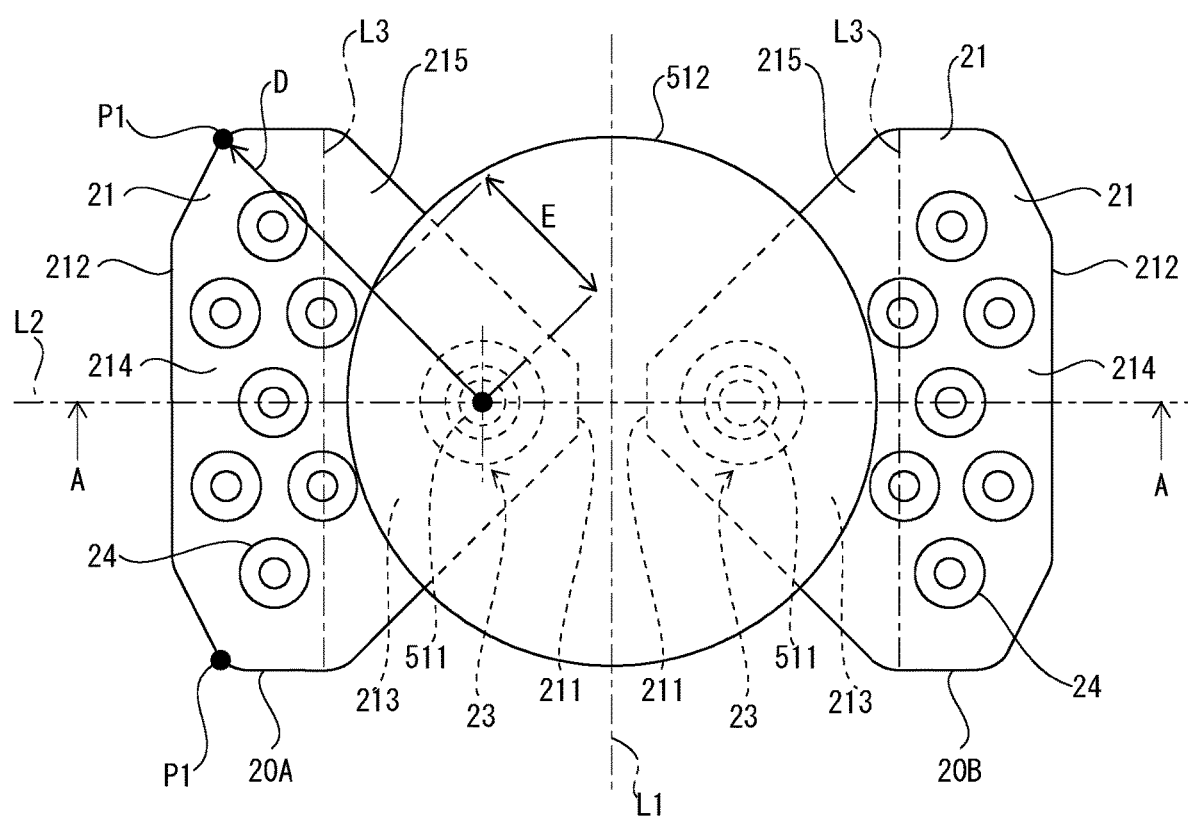
FIG. 3 illustrates a positional relationship between the land of the first connection part shown in FIG. 1 and an electrolytic capacitor.

FIG. 3 illustrates a positional relationship between the electrolytic capacitor 51 and the first connection parts 20A and 20B in a case where the electrolytic capacitor 51 is arranged on the printed wiring board 1. In FIG. 3, a description of some of the sub-heat conducting parts 24 is omitted.

With reference to FIG. 3, the upper surface of the land 21 further includes a shielded area 213 and an exposed area 214. The shielded area 213 and the exposed area 214 are defined in state in which the electrolytic capacitor 51 is arranged on the printed wiring board 1. The state in which the electrolytic capacitor 51 is arranged on the printed wiring board 1 means a state in which the two terminals 511 included in the electrolytic capacitor 51 are inserted into respective through-holes 23 of the first connection parts 20A and 20B. This state does not relate to whether or not the electrolytic capacitor 51 is soldered to the printed wiring board 1

The shielded area 213 is, out of the upper surface of the land 21, an area between the edge 211 of the land 21 and an outer edge of a body 512 of the electrolytic capacitor 51. In a case where the printed wiring board 1 on which the electrolytic capacitor 51 is arranged is viewed from above, the shielded area 213 is hidden by the electrolytic capacitor 51. In this embodiment, the shielded area 213 is a part of the enlarged area 215.

The exposed area 214 is, out of the upper surface of the land 21, an area between the edge 212 of the land 21 and the outer edge of the body 512 of the electrolytic capacitor 51. In a case where the printed wiring board 1 on which the electrolytic capacitor 51 is arranged is viewed from above, the exposed area 214 is exposed without being hidden by the electrolytic capacitor 51. In this embodiment, the exposed area 214 is a part of the enlarged area 215.

Conditions of the exposed area 214 being formed will be further described in detail below. Two points P1 that are set on an edge of the land 21 are, out of an outer edge of the land 21, located farthest from a center 23C of the through-hole 23. A line segment D extends from the center 23C to one of the two points P1 on the upper surface of the land 21. In FIG. 3, the line segment D is indicated by an arrow. In a case where the wiring board body 10 on which the electrolytic capacitor 51 is arranged is viewed from above, the points P1 are exposed without being hidden by the electrolytic capacitor 51. That is, the point P1 are located on the exposed area 214.

That is, in a case where a length of the line segment D is, in a direction in which the line segment D extends, longer than a distance E between one of the two terminals 511 and the outer edge of the body 512 of the electrolytic capacitor 51, the exposed area 214 is formed on the land 21.

(Heat-Receiving Back Surface 22)

With reference to FIG. 1, the heat-receiving back surface 22 is formed on the back surface 12 of the wiring board body 10, and is connected to a lower end of the through-hole 23 and a lower end of each of the sub-heat conducting parts 24. A shape and size of the heat-receiving back surface 22 are not particularly limited.

(Through-Hole 23)

With reference to FIG. 1, the through-hole 23 interconnects the land 21 and the heat-receiving back surface 22. The two terminals 511 included in the electrolytic capacitor 51 are inserted into the through-holes 23.

The through-hole 23 includes a conductive film 231. The conductive film 231 is a film of a conductor that is formed on a wall surface of a hole 232 vertically passing through the wiring board body 10, and connects the land 21 and the heat-receiving back surface 22.

With reference to FIG. 2, the upper end of the through-hole 23 is connected to the land 21. The through-hole 23 is opened in the shielded area 213 of the land 21.

(Sub-Heat Conducting Part 24)

With reference to FIG. 1, each of the sub-heat conducting parts 24 connects the land 21 and the heat-receiving back surface 22. Each of the sub-heat conducting parts 24 is a so-called via-hole. Each of the sub-heat conducting parts 24 includes a conductive film 241. The conductive film 241 is formed on a wall surface of a hole 242 vertically passing through the wiring board body 10, and connects the land 21 and the heat-receiving back surface 22.

With reference to FIG. 2, the upper end of each of the plurality of the sub-heat conducting parts 24 is connected to the exposed area 214 of the land 21. The plurality of the sub-heat conducting parts 24 is opened in the exposed area 214 of the land 21.

(Inner Heat Conducting Parts 25 and 26)

Each of inner heat conducting parts 25 and 26 is formed in an interior of the wiring board body 10, and connects the through-hole 23 and each of the sub-heat conducting parts 24. Specifically, the inner heat conducting part 25 is arranged between the resin layer 101 and the resin layer 103. The inner heat conducting part 26 is arranged between the resin layer 103 and the resin layer 105.

(Relationship Between First Connection Parts 20A and 20B)

As described above, the first connection parts 20A and 20B are plane-symmetric with respect to the plane including the reference line L1 perpendicular to the wiring board body 10.

With reference to FIG. 2, a shape of the upper surface of the land 21 included in the first connection part 20A is identical to a shape of the upper surface of the land 21 included in the first connection part 20B. An area of the upper surface of the land 21 included in the first connection part 20A is equal to an area of the upper surface of the land 21 included in the first connection part 20B. A length of the outer edge of the land 21 included in the first connection part 20A is equal to a length of the outer edge of the land 21 included in the first connection part 20B. A number of the sub-heat conducting parts 24 included in the first connection part 20A is equal to a number of the sub-heat conducting parts 24 included in the first connection part 20B.

<1.4. Second Connection Parts 30A and 30B>

A heat conductivity of each of the second connection parts 30A and 30B is higher than the heat conductivity of the wiring board body 10. Specifically, the second connection parts 30A and 30B are made of conductive metals. Each of the second connection parts 30A and 30B includes a land 31.

Two lands 31 are formed on the front surface 11 of the wiring board body 10. The two lands 31 are reflow soldered to two terminals 521 of the chip component 52, respectively. The two lands 31 are not connected to any conductor pattern formed on the back surface 12 of the wiring board body 10.

<2. Reflow Soldering Method Using Printed Wiring Board 1>

Figure 4:
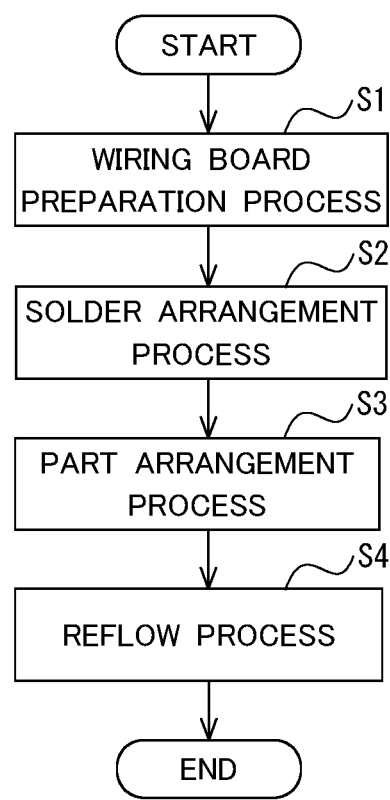
FIG. 4 is a flowchart of a soldering method according to the embodiment of the invention.

FIG. 4 is a flowchart of a soldering method using the printed wiring board 1 shown in FIG. 1. With reference to FIG. 4, first, the printed wiring board 1 shown in FIG. 1 is prepared (a step S1). For example, the printed wiring board 1 is baked in a constant temperature drier.

A solder is arranged on the lands 21 and 31 of the printed wiring board 1 prepared in the step S1 (a step S2). For example, a cream solder is printed on the lands 21 and 31.

The electrolytic capacitor 51 and the chip component 52 are arranged on the printed wiring board 1 on which the solder has been arranged (a step S3). Specifically, the two terminals 511 included in the electrolytic capacitor 51 are inserted into the through-holes 23, each formed in the first connection parts 20A and 20B. The chip component 52 is placed on the land 31.

The electrolytic capacitor 51 and the chip component 52 that are arranged on the printed wiring board 1 are reflow soldered to the printed wiring board 1 (a step S4). Specifically, in a reflow furnace, the solder arranged on the lands 21 and 31 is melted by blowing hot air to the front surface 11 and the back surface 12 of the wiring board body 10. After the solder has melted, the heated printed wiring board 1 is cooled. By cooling the printed wiring board 1, the solder melted on the lands 21 and 31 is solidified. As a result, the electrolytic capacitor 51 and the chip component 52 are physically fixed on the printed wiring board 1.

As described above, by using the printed wiring board 1, it is possible to fix both the electrolytic capacitor 51 having a large heat capacity and the chip component 52 having a small heat capacity on the printed wiring board 1 with a single reflow soldering. The reason will be described in detail below.

First, the reason why it is difficult to reflow solder both the electrolytic capacitor 51 and the chip component 52 to a conventional printed wiring board will be described.

In a case where both the electrolytic capacitor 51 and the chip component 52 are reflow soldered to the conventional printed wiring board, a temperature of a land connected with the electrolytic capacitor 51 is increased by the hot air from the reflow furnace. Since the heat capacity of the electrolytic capacitor 51 is very large, the body 512 of the electrolytic capacitor 51 absorbs heat via the two terminals 511 from the land. A temperature of a land connected with the chip component 52 is increased by the hot air from the reflow furnace. The heat capacity of the chip component 52 is far smaller than the heat capacity of the electrolytic capacitor 51. The land connected with the chip component 52 reaches a melting temperature of the solder more quickly than the land connected with the electrolytic capacitor 51. That is, at a time at which the solder on the land connected with the chip component 52 has melted, the solder on the land connected with the electrolytic capacitor 51 has not melted yet. In a case where the conventional printed wiring board is heated until the solder on the land connected with the electrolytic capacitor 51 melts, a heating time may exceed a heat-resistant time of the chip component 52.

By raising a set temperature of the reflow furnace, it is possible to shorten a time until the temperature of the land connected with the electrolytic capacitor 51 reaches the melting temperature of the solder. However, since the chip component 52 may be heated to a temperature exceeding a heat-resistant temperature of the chip component 52, it is not realistic to raise the set temperature of the reflow furnace.

As described above, when the electrolytic capacitor 51 and the chip component 52 are reflow soldered to the conventional printed wiring board, the chip component 52 may be broken by heat. Therefore, it is difficult to simultaneously reflow solder an element having a large heat capacity, such as the electrolytic capacitor 51, and an element having a small heat capacity, such as the chip component 52, to the conventional printed wiring board.

On the other hand, it is possible to simultaneously reflow solder the electrolytic capacitor 51 and the chip component 52 to the printed wiring board 1. This is because it is possible to shorten a time until the temperature of the land 21 reaches the melting temperature of the solder. Hereinafter, the reflow soldering method using the printed wiring board 1 will be described in detail.

The heat conductivity of each of the first connection parts 20A and 20B is higher than the heat conductivity of the wiring board body 10. Therefore, the first connection parts 20A and 20B are heated by the hot air from the reflow furnace more quickly than the wiring board body 10.

Particularly, since the exposed area 214 of the upper surface of the land 21 directly receives the hot air from the reflow furnace, the exposed area 214 is heated more quickly than the shielded area 213. The size of the enlarged area 215 in the direction in which the reference line L1 extends decreases as approaching to the reference line L1. An area of the exposed area 214 is larger than an area of the shielded area 213. As a result, the heat received by the exposed area 214 is concentrated to the shielded area 213.

The heat-receiving back surface 22 is heated by the hot air from below. Since the upper end of the through-hole 23 is connected to the shielded area 213 of the land 21, the heat received by the heat-receiving back surface 22 is transmitted via the through-hole 23 to the shielded area 213.

Since the upper end of each of the sub-heat conducting parts 24 is connected to the exposed area 214 of the land 21, the heat received by the heat-receiving back surface 22 reaches the exposed area 214 via each of the sub-heat conducting parts 24. The exposed area 214 is heated not only by the hot air from above but also by the heat received by the heat-receiving back surface 22. As a result, the heat that is transmitted from the exposed area 214 to the shielded area 213 increases.

Since each of the inner heat conducting parts 25 and 26 connects the through-hole 23 and each of the sub-heat conducting parts 24, the heat received by the heat-receiving back surface 22 is transmitted from each of the sub-heat conducting parts 24 to each of the inner heat conducting parts 25 and 26. The heat transmitted to each of the inner heat conducting parts 25 and 26 is transmitted via the through-hole 23 to the shielded area 213.

As described above, in the printed wiring board 1, it is possible to transmit the heat received from the reflow furnace through various channels to the shielded area 213. Even when the heat of the shielded area 213 is absorbed by the electrolytic capacitor 51, in the printed wiring board 1, it is possible to supply a large amount of heat through various channels to the shielded area 213. Therefore, in the printed wiring board 1, it is possible to shorten a time until a temperature of the solder arranged on the upper surface of the land 21 reaches the melting temperature.

In the second connection parts 30A and 30B, since the land 31 is not connected to any conductor pattern formed on the back surface 12 of the wiring board body 10, the land 31 is not heated by the hot air from below. Temperature rise in the land 31 is nearly equal to temperature rise in a land formed on the conventional printed wiring board.

Therefore, in the printed wiring board 1, it is possible to shorten a difference in melting times between the solder arranged on the land 21 and the solder arranged on the land 31 comparted to the conventional printed wiring board. In a case where the electrolytic capacitor 51 and the chip component 52 are simultaneously reflow soldered to the printed wiring board 1, it is possible to prevent the chip component 52 from being broken. In other words, in the printed wiring board 1, it is possible to simultaneously reflow solder the electrolytic capacitor 51 and the chip component 52 without raising a temperature of the hot air or lengthening the heating time.

The first connection parts 20A and 20B are formed plane-symmetrically. In two lands 21, the number of the sub-heat conducting parts 24 that is connected to one of the two lands 21 is equal to the number of the sub-heat conducting parts 24 that is connected to the other of the lands 21. The areas of the lands 21 respectively included in the first connection parts 20A and 20B are equal. The lengths of the outer edges of the lands 21 respectively included in the first connection parts 20A and 20B are equal. The outer edge of the land 21 is an outer periphery of the upper surface of the land 21. Thus, since it is possible to suppress a variation in the temperature rise in the two lands 21, it is possible to reduce a variation in melting timings of the solder arranged on the two lands 21. That is, since the first connection parts 20A and 20B are formed plane-symmetrically, it is possible to facilitate an adjustment of the heating time by the reflow furnace.

(Modification 1)

In the embodiment described above, although an example in which the land 31 is formed on the front surface of the wiring board body 10 has been described, the invention is not limited thereto. A land 31 may be formed on a back surface 12 of a wiring board body 10. The lands 31 may be formed on both a front surface 11 and the back surface 12 of the wiring board body 10. In any case, the land 31 formed on the back surface 12 of the wiring board body 10 is not connected to any conductor pattern formed on the front surface 11 of the wiring board body 10. The conductor pattern formed on the front surface 11 includes a land 21 and the land 31 formed on the front surface 11.

(Modification 2)

Figure 5:
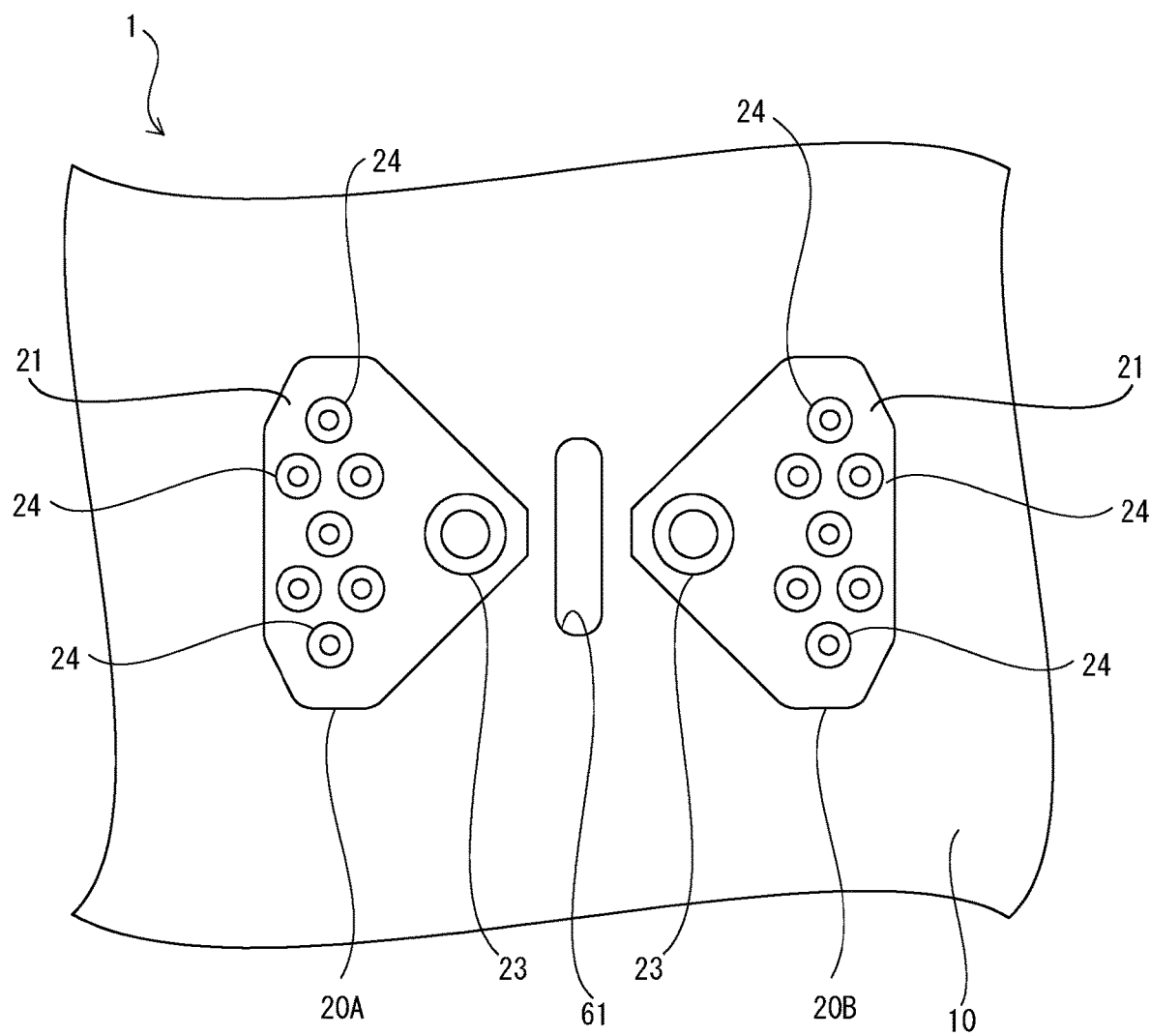
FIG. 5 illustrates a modification example of the first connection part shown in FIG. 1.

In the embodiment described above, although an example in which the holes 232 and 242 are formed in the wiring board body 10 has been described, the invention is not limited thereto. A hole other than holes 232 and 242 may vertically pass through a wiring board body 10. For example, as illustrated in FIG. 5, a hole 61 passing through the wiring board body 10 may be formed between a first connection part 20A and a first connection part 20B. In this case, hot air that is blown from below passes through the hole 61 and reaches a shielded area 213. Thus, it is possible to heat the shielded area 213 further more quickly.

(Modification 3)

In the embodiment described above, although an example in which the two lands 21 are arranged plane-symmetrically, the invention is not limited thereto. An arrangement of two lands 21 is not particularly limited as long as shapes of the two lands 21 illustrated in FIG. 2 are identical. By forming the two lands 21 into the same shape, it is possible to reduce a variation in temperature rise in the two lands 21.

(Other Modification)

A number of sub-heat conducting parts 24 included in each of first connection parts 20A and 20B is not particularly limited. An upper end of at least one of the sub-heat conducting parts 24 included in the first connection part 20A may be formed in an exposed area. The same applies to the sub-heat conducting parts 24 included in the first connection part 20B.

In the embodiment described above, although an example in which the shapes of the two lands 21 are identical has been described, the invention is not limited thereto. Shapes of two lands 21 do not need to be identical as long as areas of upper surfaces of the two lands 21 are equal. Even in this case, it is possible to reduce a variation in temperature rise in the two lands 21. The areas of the two lands 21 do not need to be equal as long as lengths of outer edges of the two lands 21 are equal. Even in this case, it is possible to reduce the variation in temperature rise in the two lands 21. The first connection parts 20A and 20B do not need to be plane-symmetric.

In the embodiment described above, although each of the two lands 21 includes the exposed area 214 has been described, the invention is not limited thereto. Each of the two lands 21 may be completely covered with an electrolytic capacitor 51.

In the embodiment described above, although the wiring board body 10 includes five resin layers has been described, the invention is not limited thereto. A number of resin layers included in a wiring board body 10 is arbitrary. For example, in a case where the wiring board body 10 includes three resin layers, first connection parts 20A and 20B may include one inner heat conducting part. In a case where the wiring board body 10 includes five resin layers or more, the first connection parts 20A and 20B may include two or more inner heat conducting parts.

While the invention has been shown and described in detail, the foregoing description is in all aspects illustrative and not restrictive. It is therefore understood that numerous other modifications and variations can be devised without departing from the scope of the invention.

What is claimed is:

1. A printed wiring board comprising:
   a wiring board body;
   a first connection part that has a higher heat conductivity than a heat conductivity of the wiring board body, and connects the wiring board body and a first element; and
   a second connection part that has a higher heat conductivity than the heat conductivity of the wiring board body, and connects the wiring board body and a second element, wherein
   the first connection part includes: (i) a heat-receiving front surface that is a first land formed on a front surface of the wiring board body; (ii) a heat-receiving back surface formed on a back surface of the wiring board body; (iii) a main-heat conducting part that is a through-hole into which a terminal of the first element is inserted, and which inter-connects the heat-receiving front surface and the heat-receiving back surface; and (iv) a sub-heat conducting part that inter-connects the heat-receiving front surface and the heat-receiving back surface,
   the second connection part includes a second land that is formed on one of the front and back surfaces of the wiring board body, and is not connected to any conductor pattern formed on an opposite one of the front and back surfaces of the wiring board body,
   the heat-receiving front surface includes: (i) a shielded area that is hidden by the first element when the terminal of the first element is connected to the first connection part, and is connected to an end of the main-heat conducting part; and (ii) an exposed area that is exposed when the first element is connected to the first connection part, and is connected to an end of the sub-heat conducting part, an area of the exposed area is larger than an area of the shielded area, and
   the first connection part further includes an inner heat conducting part that is formed in an interior of the wiring board body and inter-connects the main-heat conducting part and the sub-heat conducting part, the inner heat conducting part being located between first and second layers of the wiring board body, the first layer located between the heat-receiving front surface and the inner heat conducting part, and the second layer located between the heat-receiving back surface and the inner heat conducting part.

2. The printed wiring board according to claim 1, wherein when the first element is connected to the first connection part, a distance between the main-heat conducting part and an outer edge of the heat-receiving front surface in a predetermined direction is longer than a distance between the terminal of the first element and an outer edge of the first element in the predetermined direction, and the predetermined direction is a direction in which, on the front surface of the wiring board body, the distance between the main-heat conducting part and the outer edge of the heat-receiving front surface is greatest.

3. The printed wiring board according to claim 1 comprising a plurality of the first connection parts, wherein numbers of the sub-heat conducting parts included in the plurality of the first connection parts are equal.

4. The printed wiring board according to claim 1 comprising a plurality of the first connection parts, wherein lengths of the outer edges of a plurality of the heat-receiving front surfaces included in the plurality of the first connection parts are equal.

5. The printed wiring board according to claim 1 comprising a plurality of the first connection parts, wherein areas of the plurality of the first connection parts are equal.

6. The printed wiring board according to claim 1 comprising a plurality of the first connection parts, wherein shapes of the plurality of the first connection parts are identical.

* * * * *